US 6,728,928 B2

(12) United States Patent
Jeon et al.

(10) Patent No.: US 6,728,928 B2
(45) Date of Patent: Apr. 27, 2004

(54) MODIFIED VITERBI DETECTOR FOR JITTER NOISE DOMINANT CHANNELS

(75) Inventors: Taehyun Jeon, San Jose, CA (US);
Ming-Tak Leung, Sunnyvale, CA (US);
Leo Ki-Chun Fu, San Jose, CA (US);
Younggyun Kim, Irvine, CA (US)

(73) Assignee: Texas Instruments Incorporated, Dallas, TX (US)

( * ) Notice: Subject to any disclaimer, the term of this patent is extended or adjusted under 35 U.S.C. 154(b) by 403 days.

(21) Appl. No.: 09/681,233

(22) Filed: Mar. 2, 2001

(65) Prior Publication Data

US 2002/0184597 A1 Dec. 5, 2002

(51) Int. Cl.[7] .......................... H03M 13/00; H04L 27/06
(52) U.S. Cl. ........................................ 714/795; 375/341
(58) Field of Search ................................. 714/795, 786, 714/791–794; 375/341, 340; 360/46, 65; 341/59

(56) References Cited

U.S. PATENT DOCUMENTS 6,282,251 B1 * 8/2001 Worstell ...................... 375/341

OTHER PUBLICATIONS

Song et al., Low density parity check ocdes for Magnetic recording channels, Sep. 2000, IEEE Trans. on Magnetics, vol. 36, No. 5, pp. 2183–2186.*
Han et al., Performance and implementation of adaptive partial response maximum likelihood detection, Sep. 1998, IEEE Trans. on magnetics, vol. 34, No. 5, pp. 3806–3815.*
Conway, Thomas, A new target response with parity coding for high density magnetic recording channels, Jul. 1998, IEEE Trans. on magnetics, vol. 34, No. 4, pp. 2382–2386.*
Chen et al., Performance estimation for maximum–likelihood detection for channels with transition noise, May 1998, IEEE Trans. on magnetics vol. 34, No. 3, pp. 754–762.*

* cited by examiner

Primary Examiner—Albert Decady
Assistant Examiner—Shelly A Chase
(74) Attorney, Agent, or Firm—W. Daniel Swayze, Jr.; W. James Brady; Frederick J. Telecky, Jr.

(57) ABSTRACT

A Viterbi detector includes circuitry for receiving an NRZ encoded received signal in an EEPR4 channel to decode the signal according to $\lambda_k^{(i)} = (z_k - y_k^{(i)})^2 - \alpha^{(i)}$, wherein $\alpha^{(i)}$ is m $\alpha$, $\alpha$ is a positive constant, m is a number of transitions within the most current four symbol periods, $\lambda_k^{(i)}$ is a branch metric at time k for an $i^{th}$ Viterbi branch, k is a time period, $z_k$ is a received value at time k, $\lambda_k^{(i)}$ is a metric used to determine a next state of the Viterbi based upon a maximum likelihood evaluation for an $i^{th}$ branch, $a_k$, $a_{k-1}$, $a_{k-2}$, $a_{k-3}$ are received state values at respective time periods k, k−1, k−2, and k−3, and $y_k$ is an ideal sample associated with an $i^{th}$ branch. The detector is operated to decode a received data value by determining whether the received value is in a space containing first (90) and second (92) possible decode values. The space has a boundary (96) substantially equidistant from the first (90) and second (92) possible decode values and separating the first and second possible decode values. If the received value is within a first portion of the space closest to the first decode value, the received value is decoded as the first decode value. If the received value is within a second portion of the space closest to the second decode value, it is decoded as the second decode value. A value ($\alpha$) that estimates an amount of jitter noise in a channel (26) through which the received value has passed is produced. The boundary (96) is then moved an additive amount (1$\alpha$, 2$\alpha$, 3$\alpha$) determined by the value that estimates an amount of jitter noise, wherein the boundary is moved (97, 98, 99) to enlarge whichever of the first and second spaces that contains a larger amount of jitter noise.

28 Claims, 4 Drawing Sheets

MODIFIED VITERBI DETECTOR FOR JITTER NOISE DOMINANT CHANNELS

BACKGROUND OF INVENTION

1. Field of Invention

This invention relates to improvements in data detection techniques and hardware using a Viterbi algorithm, and more particularly to improvements in methods and apparatuses for performing Viterbi data detection in channels in which channel noise is dependent upon data or jitter effects, and to improvements in mass data storage devices, or the like, using same.

2. Relevant Background

Transition jitter noise is one of the major sources of detection errors in high density recording channels. Implementation complexity of the optimal detector for such channels is high, due to the data dependency and correlated nature of the jitter noise. In the past, it has been proposed to modify the branch metric of the Viterbi algorithm applied to partial response (PR) channels using a multiplicative factor to adjust the branch metric to account for jitter induced noise in the channel. However, such multiplicative adjustments for in each branch metric in the Viterbi trellis are complicated and are difficult to implement in hardware.

More particularly, in one attempt to make adjustments for data detection in the presence of jitter noise in read channels of mass data storage devices, the possible areas of data uncertainty are scaled, depending upon the magnitude of the jitter noise that is detected. However, the scaling is implemented via the multiplicative algorithm, as mentioned. Although such multiplicative algorithm is considered to be relatively accurate in affecting the scaling adjustment and simpler compared to the optimal detector implementation, it still requires significant hardware complexity.

For a data dependent noise channel, the maximum likelihood (ML) detector finds a noiseless channel output sequence which maximizes the likelihood function. The ML detector implementation for such channel requires large number of states in the Viterbi trellis and matrix multiplication for each branch metric calculation. A compromised solution has been proposed in which off-diagonal elements of the covariance matrix are ignored in the metric calculation. The resulting modified branch metric assuming Gaussian noise is defined by $\ln(\sigma_k^2)+(z_k-y_k)^2/\sigma_k^2$, where $\sigma_k^2$ is the noise variance, $z_k$ is an observation sample, and $y_k$ is a noiseless channel output at time k, respectively. The calculation of the metric requires additional multiplication and addition over the conventional Viterbi algorithm.

What is needed is a simplified technique for modifying the Viterbi algorithm that does not require the application of a multiplicative metric adjustment, and which can be implemented in hardware with relative ease.

SUMMARY OF INVENTION

In light of the above, therefore, it is an object of the invention to provide a simplified technique for modifying the Viterbi algorithm that does not require the application of a multiplicative metric adjustment, and which can be implemented in hardware with relative ease.

It is another object of the invention to provide a method for adjusting a Viterbi detector in dependence upon the magnitude of expected jitter noise variance existing in a channel of a mass data storage device, as created by magnetic flux or equivalently input binary data transitions in the channel.

It is still another object of the invention to provide a method for adjusting the decision boundary between two words or equivalently between two competing branches in the Viterbi trellis to be detected or selected using an additive adjustment coefficient based upon estimated jitter noise variance existing in the read channel of a mass data storage device.

It is yet another object of the invention to provide a method for calculating an adjustment coefficient for use in modifying a Viterbi detector for use in a read channel of a mass data storage device.

Thus, to address detection errors produced by transition jitter noise, a hardware efficient detector is provided in which the branch metric of the Viterbi algorithm is modified by an additive term and applied to partial response (PR) channels. The detector may also be combined with run length limited modulation coding. The additional complexity over the conventional Viterbi algorithm to incorporate the modified branch metric is an addition for each branch metric in the Viterbi trellis.

According to a broad aspect of the invention, a Viterbi detector is presented. The Viterbi detector includes circuitry for receiving an received noisy signal whose input binary data is NRZ encoded where the data transition from one value to another potentially creates jitter induced noise. In the EEPR4 equalized channel which is one of the classes in a partial response (PR) channel, the detector decodes the received value using modified branch metric $\lambda_k^{(i)}=(z_k-y_k^{(i)})^2-\alpha^{(i)}$, in which $\alpha^{(i)}$ is m $\alpha$, $\alpha$ is a positive constant, m is a number of transitions within the most current four symbol periods, $\lambda_k^{(i)}$ is a branch metric at time k for an $i^{th}$ Viterbi branch, k is a time period, $z_k$ is a received value at time k, $\lambda_k^{(i)}$ is a metric used to determine the next state of the Viterbi based upon a maximum likelihood evaluation for an $i^{th}$ branch, and $y_k$ is an ideal sample associated with an $i^{th}$ branch.

According to another broad aspect of the invention, a method for decoding a received value is presented. The method includes determining whether the received value is in a space associated with one of the possible binary input data values. The space has a boundary substantially equidistant from the two possible points each of which is associated with one of possible decode input binary data. If the received value is within a first portion of the space closest to the point associated with first decode value, the received value is decoded as the first decode value. If the received value is within a second portion of the space closest to the second point associated with the second decode value, it is decoded as the second decode value. A value that estimates an amount of jitter noise in a channel is produced. The boundary is then moved by an additive amount determined based on the value that estimates an amount of jitter noise, wherein the boundary is moved to enlarge whichever of the first and second spaces that contains a larger amount of jitter noise.

According to another broad aspect of the invention, a Viterbi detector is presented. The Viterbi detector includes for determining whether a received value is either of first or second decode value. The circuitry has first and second spaces containing a set of possible received values. The first and second spaces respectively surround each of the points associated with the first and second decode values. The circuitry has a boundary separating the first and second spaces. If a detected value is within the first space it is decoded as the first decode value, and if the detected value is within the second space, it is decoded as the second decode value. Circuitry is provided for producing a value that estimates an amount of jitter noise contained in the received value which is a function of a series of binary input data. Circuitry is also provided for moving the boundary by an amount determined based on the value that estimates an amount of jitter noise. The boundary is thus moved to enlarge whichever of the first and second spaces that contains the largest amount of jitter noise.

According to yet another broad aspect of the invention, a mass data storage device of the type in which a sensor detects magnetic transitions recorded on a magnetic media is presented. The mass data storage device includes a Viterbi detector, which includes for determining whether a received value is either of first or second decode value. The circuitry has first and second spaces containing a set of possible points associated with the first and second decode values. The first and second spaces respectively surround each of the points associated with first and second decode values. The circuitry also has a boundary separating the first and second spaces, such that if a detected value is within the first space it is decoded as the first decode value, and if the detected value is within the second space, it is decoded as the second decode value. Circuitry is also provided for producing a value that estimates an amount of jitter noise contained in the received value which is a function of a series of binary input data. Circuitry is also provided for moving the boundary an amount determined by the value that estimates an amount of jitter noise. The boundary is moved to enlarge whichever of the first and second spaces that contains the largest amount of jitter noise.

According to still another broad aspect of the invention, a method is presented for compensating for jitter noise in a channel in a mass storage device. The method includes an additive value related to an amount of jitter noise in the channel which is dependent upon input data bit values stored and retrieved, such that a magnitude of the jitter noise is related to the number and the location of bit transitions in a word indicating a branch in the Viterbi trellis to be determined. A detection boundary is then moved between possible values by an additive amount based on the pattern of the bit transitions associated with the branch.

BRIEF DESCRIPTION OF DRAWINGS

The invention is illustrated in the accompanying drawings, in which.

In the various figures of the drawings, like reference numerals are used to denote like or similar parts.

DETAILED DESCRIPTION

Figure 1:
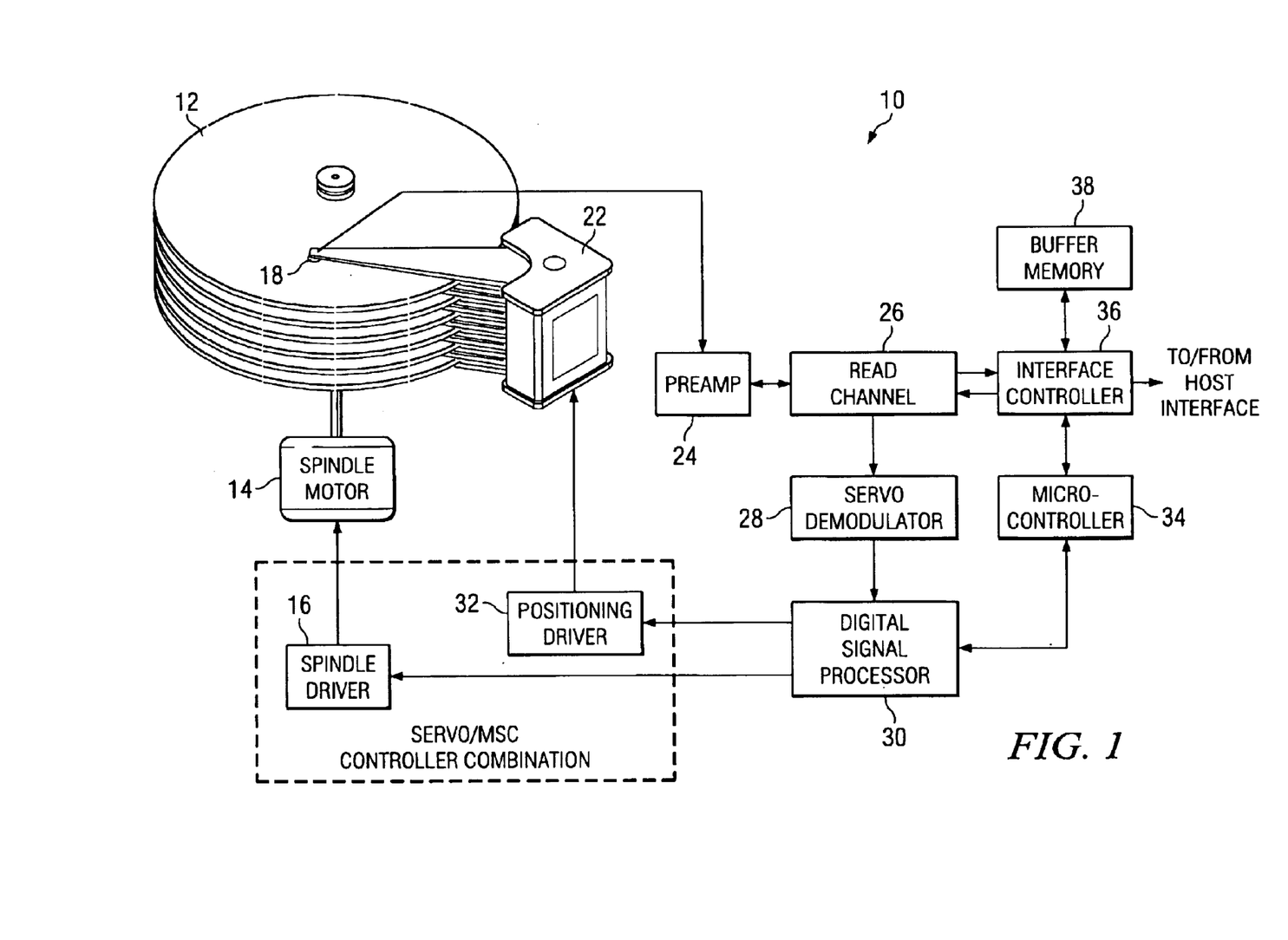
FIG. 1 is a block diagram of a generic disk drive system, illustrating one general environment in which the invention may be practiced.

FIG. 1 is a block diagram of a generic disk drive system 10, which represents the general environment in which the invention may be practiced. The system 10 includes a stack of magnetic media disks 12 that are rotated by a spindle motor 14 and spindle driver circuit 16. A data transducer or head 18, carried on a positioning arm 20 is locatable along selectable radial tracks (not shown) of the disk by a voice coil motor 22. The radial tracks may contain magnetic states that contain information about the tracks, such as track identification data, location information, synchronization data, as well as user data, and so forth. The head 18 is used both to record user data to and read user data back from the disk 12, as well as to detect signals that identify the tracks and sectors at which data is written, and to detect servo bursts that enable the head 18 to be properly laterally aligned with the tracks of the disk 12, as below described.

Analog electrical signals that are generated by the head 18 in response to the magnetic signals recorded on the disk 12 are preamplified by a preamplifier 24 for delivery to read channel circuitry 26. Servo signals, below described in detail, are detected and demodulated by one or more servo demodulator circuits 28 and processed by a digital signal processor (DSP) 30 to control the position of the head 18 via a positioning driver circuit 32. The servo data that is read and processed may be analog data that is interpreted by the DSP 30 for positioning the head 18.

A microcontroller 34 is typically provided to control the DSP 30, as well as an interface controller 36 to enable data to be passed to and from a host interface (not shown) in known manner. A data memory 38 may be provided, if desired, to buffer data being written to and read from the disk 12.

Figure 2:
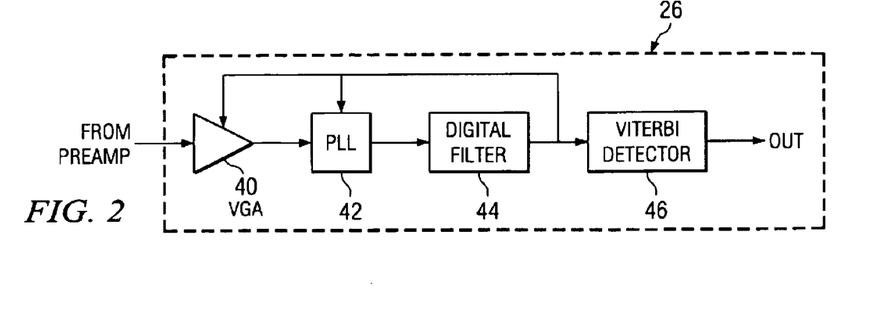
FIG. 2 is a block diagram of a portion of the read channel in the circuit of FIG. 1, showing a placement of a Viterbi detector therein that can compensate for jitter noise, according to a preferred embodiment of the invention.

With reference now additionally to FIG. 2, a block diagram of a portion of the read channel circuitry 26 of FIG. 1 is shown. The read channel 26 generally includes at least a variable gain amplifier (VGA) 40 that receives the signal from the preamplifier 24 and amplifies it to a controlled level. The signal is applied to a phase locked loop 42, which is controlled by a signal from the output of a digital filter 44. The output of the digital filter 44 also controls the gain of the VGA 40. The output of the digital filter 44 is then applied to a Viterbi detector 46 to produce a detected output to the remaining circuitry.

According to the present invention, the Viterbi detector 46 is modified for a jitter noise dominant channel. More particularly, in a high-density data storage channel, the Viterbi algorithm (VA) is typically used to detect the channel input data from a noisy channel output signal and achieves the maximum likelihood sequence detection performance. Ordinarily, additive white Gaussian noise (AWGN) is assumed to exist at the input of the detector. However, as the recording density increases, media noise becomes a dominant noise source. The media noise can be modeled as the position jitter of the transition response.

Figure 3:
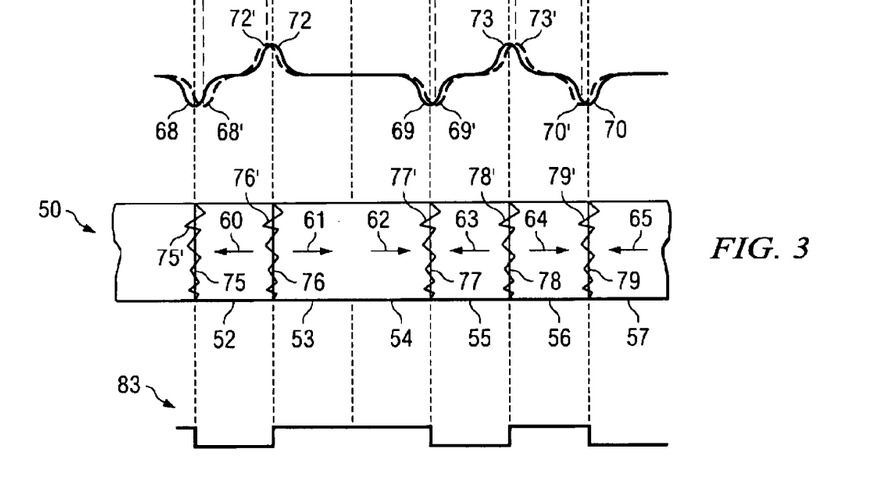
FIG. 3 is a diagram showing a portion of a track of a mass data storage device, illustrating the manner in which data is recorded thereon, juxtaposed with waveforms showing the origin of jitter noise to be compensated by the Viterbi detector and detection techniques according to a preferred embodiment of the invention.

For example, with reference additionally to FIG. 3, a portion of a track 50 is shown, over which the head 18 (shown in FIG. 1) rides. The track 50 includes a number of sections 52–57 on which data has been written. Data is written by orienting the magnetic domains of each section 52–57 using NRZ encoding. This means that if a magnetic domain changes direction from one section to an adjacent section, a transition in the data is represented. Thus, a number of magnetic domains 60–65 in respective directions representing the recorded data.

For example, with reference additionally to FIG. 3, a portion of a track 50 is shown, over which the head 18 (shown in FIG. 1) rides. The track 50 includes a number of sections 52–57 on which data has been written. Data is written by orienting the magnetic domains of each section 52–57 using NRZ encoding. This means that if a magnetic domain changes direction from one section to an adjacent section, a transition in the data is represented. Thus, a number of magnetic domains 60–65 in respective directions representing the recorded data.

As a result of the fuzzy transitions, the pulses that are generated by the head 18 may be displaced in time from those that would have been produced if the transitions were crisp or sharp. The displaced pulses are shown by the dotted line pulses 68'–73'. For reference, a time line 80 is shown in FIG. 3, the time pulses shown being, for example, the times at which samples are determined, as established by the PLL 42 shown in FIG. 2. It can be seen that if the magnitude of the samples of the pulses 68'–73' were to be measured with respect to the actual sample times determined as if the transitions 75'–79' were crisp or sharp, the determined values would be different from the samples of the ideal waveforms 68–70. This is the "jitter noise" addressed by the modified Viterbi detector of the invention.

This position jitter results in data dependent noise, since the noise arises only when a magnetic transition occurs. Also, a given noise sample is correlated with neighboring noise samples. The conventional VA tuned to the AWGN may suffer from the performance degradation due to the correlated and data-dependent noise characteristics. Thus, according to the present invention, the branch metric of the conventional VA is modified to improve the performance of the detector by utilizing the jitter noise characteristics. The purpose of this invention is to develop a hardware efficient and reliable detection scheme in a jitter noise dominant channel.

Figure 4:
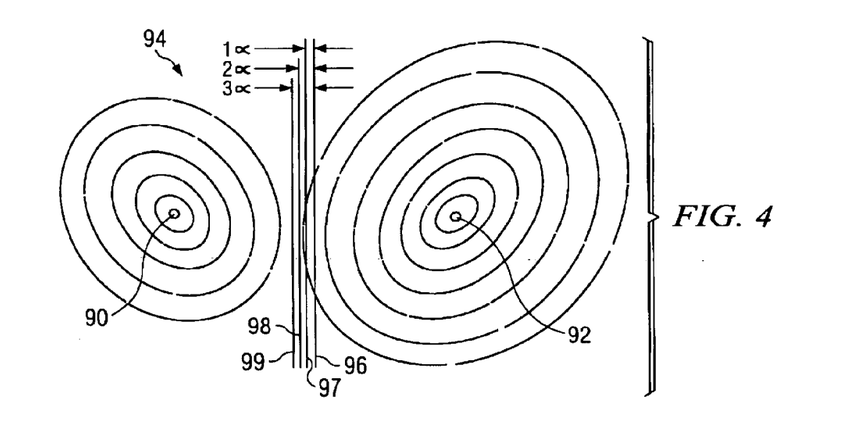
FIG. 4 is a diagram of a portion of a data space, showing two data points and the space separating them, overlain with regions produced by jitter noise, and the manner by which the boundary separating the data points is moved, according to a preferred embodiment of the invention.

Thus, with reference now additionally to FIG. 4, two possible data values 90 and 92 are shown in a data space 94. The points 90 and 92 in the received signal space are associated with a series of input binary data, for example, "000" and "101". In the case illustrated, the distance between the two points is represented by a boundary 96, which ordinarily is one-half the actual distance between the two points. In a case without jitter noise, the distance represents the maximum distance that a detected signal may vary from the encoded value and still enable correct decoding. In the case of additive white Gaussian noise, the uncertainty introduced by the noise is relatively symmetrical with respect to each of the encoded data points in the received signal space. As a result, the distance between the two encoded values is not affected, and will remain along the boundary midway between the two points.

On the other hand, with respect to noise that is not symmetrically distributed over the signal space, such as jitter noise, the distribution of the noise in the signal space is not symmetrical, and may result in skewing the value that is received from the channel. More particularly, it can be seen that if a data point of "000" is encoded and subsequently detected, no transitions occur in the data at the respective time points at which the output pulses occur, i.e., no domain changes occur on the track of the magnetic media. On the other hand, a "101" data point, for instance, will generate received value which contains lager amount of jitter noise, since two transitions induced by "101" may be imprecisely located as described above with respect to the respective time points at which they are expected to occur. The data points within the signal space, therefore, may actually be skewed beyond the distance boundary 96, which was defined above with respect to AWGN, and, would, therefore, be inaccurately decoded.

It will be appreciated that the additive adjustment made to the boundary 97 may be made dynamically or adaptively by estimating the adjustment value on-the-fly in response to actual data received. On the other hand, the values may be obtained analytically or statically in which the values are determined in advance in response to the decoding of various sets of discrete data values.

In the construction of a Viterbi detector, in accordance with a preferred embodiment of the invention, an additive metric is developed that is used to shift the boundary in the space between two detected words. The metric is based upon the assumption that a word with less transitions generates less noise or uncertainty than a word with more transitions. The amount of noise generated by certain length of input binary data stream or word also depends on the location and number of the transitions. This location depends on the channel equalization method. For example the words in EEPR4 and EPR4 channels have different meanings and generates different amount of noise even though input words are the same. It is assumed in the case of a read channel device that the number of competing words in each state in the Viterbi trellis is two, although the number of bits defining the words may be other than two, depending upon the implementation. For example, in an EEPR4, implementation, first four bits out of five-bit words are used to determine the amount of jitter noise. In EPR4 channel, transition between the current bit at time k and the time k−1 and also another transition between time k−2 and k−3, determine the amount of noise.

According to the present invention, an additive adjustment is made to change the effective location of the boundary between possible detected data words, in dependence upon the number and the location of transitions that are detected. The number of transitions that are detected represents one measure of the amount of the transition jitter noise that may be introduced in the channel. But depending on equalization targets used in the channel, the specific location of the transition is also important.

As a result, in accordance with a preferred embodiment of the invention, a value is generated that is proportional to the possible jitter noise variance that is anticipated in distinguishing adjacent data points, for example, as above, by determining the pattern of the data words on each side of the boundary. The boundary is then shifted to enlarge the signal space on the side of the boundary that includes the word corresponding to the lager noise variance. Thus, for example, in the embodiment illustrated in FIG. 4, if the data were on the left is "0000" and has no transition (assuming NRZ encoding), and the word on the right is "1001", and has two transition assuming EPR4 channel, the boundary line may be shifted by a factor of 2 times a known application factor to enlarge the area of the data word surrounding data word "1001". Other methods may be also employed, for example, by subtracting the number of transitions that can be experienced in decoding one word from the member of transitions that can experienced in decoding the other word at specific locations, respectively. The boundary is shifted in accordance with the difference.

The scaling factor referred to above can be chosen in accordance with the noise level expected in the channel, and, if desired, can be analytically or experientially derived. Thus, for example, as shown in FIG. 4, the sharp minimum distance boundary may be shifted incrementally $1\alpha$, $2\alpha$, $3\alpha$, ..., $x\alpha$ to the left, in dependence upon the value or number and location of transitions that occur in the detected word with the largest number of transitions on the right. These boundaries are illustrated by dotted lines 97–99 in FIG. 4.

Figure 5:
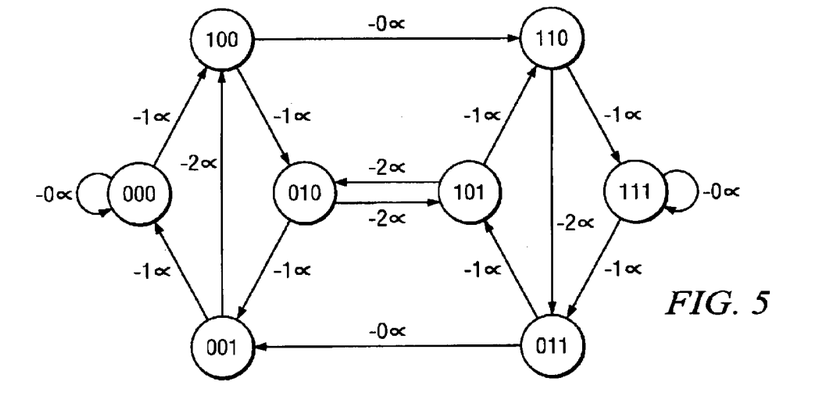
FIG. 5 is a state diagram showing state transitions for an EPR4 data detector constructed in accordance with the techniques of the present invention.

The data shifts described above are effected in the Viterbi detector to which the data is applied and detected, and is employed in determining the metric that is applied to the data values that are received at each Viterbi state. Thus, at any Viterbi state, the value that is examined to determine the proper next decode state is derived from the squared value of the difference between the received value and the ideal value and the noise variance associated with the branches connecting current and next states, which, as indicated above, is dependent upon the jitter noise variance or transition number and location of the words on the branches to be decoded at that decode state within the Viterbi detector. This is illustrated in FIG. 5, which shows a Viterbi trellis diagram showing the various paths between the trellis states, together with the additive metric that is used to adjust the boundaries between states.

According to the present invention, as outlined above, the branch metric of the Viterbi algorithm (VA) is modified using only an additive term. By doing this, a detector can be implemented efficiently without severe performance degradation for a jitter noise.

Figure 6:
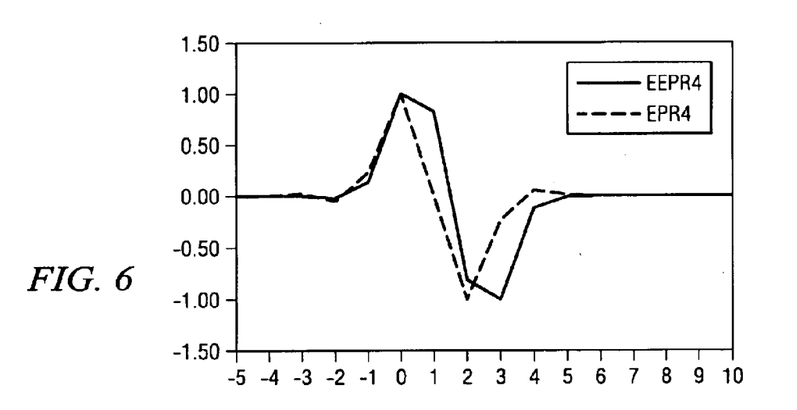
FIG. 6 is a graph of jitter noise response vs. sample time at the input to the detector in EEPR4 and EPR4 channels.

Although this detection scheme can be applied to any jitter dominant recording channels, we take EEPR4 and EPR4 equalized channels for the detailed description of the algorithm whose transition responses are (1, 3, 3, 1) and (1, 2, 1), respectively. It can be shown that for each channel the position jitter noise, $n_k^{EEPR4}$ and $n_k^{EEPR4}$, can be well approximated by: $n_k^{EEPR4}=b_k\delta_k+b_{k-1}\delta_{k-1}-b_{k-2}\delta_{k-2}-b_{k-3}\delta_{k-3}$ and $n_k^{EPR4}=b_k\delta_k-b_{k-2}\delta_{k-2}$, where $b_k$ is a channel input symbol (either ±1 or 0) which in indicates whether a positive/negative transition exists or not and $\delta_k$ is the amount of position jitter at time k. FIG. 6 is a graph of the actual jitter noise response to $b_k\delta_k$ at the input to the detector in EEPR4 or EPR4 channels. Assuming $\{\delta_k\}$ is independent and identically distributed, the variance of the noise can be represented as:

$$E\{(n_k^{EEPR4})^2|b_k,b_{k-1},b_{k-2},b_{k-3}\}=\sigma_\delta^2(b_k^2+b_{k-1}^2+b_{k-2}^2+b_{k-3}^2) \quad (1)$$

$$\text{And}\, E\{(n_k^{EPR4})^2|b_k, b_{k-1}, b_{k-2}\}=\sigma_\delta^2(b_k^2+b_{k-2}^2) \quad (2)$$

where $\sigma_\delta^2$ is the variance of $\{\delta_k\}$ and the value of $b_k^2$ is either 1 or 0 depending on the existence of the transition. As shown in equation (2), for an EEPR4 channel, the power of the position jitter noise at the output of the equalizer is proportional to the number of transitions over the last four symbol periods.

For example, if in the write current domain, the input symbol set $(a_k, a_{k-1}, a_{k-2}, a_{k-3}, a_{k-4})=(1, -1, -1, 1, -1)$, then the number of transitions within that symbol period is three. The NRZ encoded data "1" is mapped to value "+1" in write current domain and the data "0" is mapped to "−1" 83. For another example, if $(a_k, a_{k-1}, a_{k-2}, a_{k-3}, a_{k-4})=(1, -1, -1, -1, -1)$, the number of transitions is one. Here, the relationship between $b_k$ and $a_k$ is $b_k=(a_k-a_{k-1})/2$. Also, the sequence including the first set of symbols is estimated to have three times larger jitter noise power than the one including the second set as explained in equation (2).

Intuitively, this means that if the conventional Viterbi algorithm is used for a jitter dominant channel, a larger penalty is put on the branch associated with more transitions. The motivation of the branch metric modification is to allow more noise margin for the branch that includes more transitions.

According to the present invention, additive terms are used to modify the branch metric in the Viterbi trellis. Depending on the number and the position of transitions in a certain time period, different positive values ($\alpha_{(i)}$) are subtracted in calculating the branch metrics. The time period needed to examine depends on the span of the jitter noise response: four symbol periods for an EEPR4 channel and three symbol periods for an EPR4 channel.

For a partial response maximum likelihood (PRML) channel, $\alpha^{(i)}=m\,\alpha$ is used, where $\alpha$ is a positive constant and m is the number of transitions at specific locations. Based on this modifications, the branch metric $\lambda_k^{(i)}$ at time k for the $i^{th}$ branch is represented by $\lambda_k^{(i)}=(z_k-y_k(i))^2-\alpha^{(i)}$, where $z_k$ is an equalized readback sample and $y_k$ is an ideal sample associated with the $i^{th}$ branch. In Table 1, the list of next state, current symbol, current state, and the modified branch metric including the $\alpha^{(i)}$ value associated with that state transition in the trellis are shown in the write current domain for an EEPR4 channel.

TABLE 1

| Next State $a_k, a_{k-1}, a_{k-2}, a_{k-3}$ | Current Symbol $\{a_k\}$ | Current State $a_{k-1}, a_{k-2}, a_{k-3}, a_{k-4}$ | Branch Metric $\lambda_k^{(i)} = (z_k y_k^{(i)})^2 \alpha^{(i)}$ |
|---|---|---|---|
| 1, 1, 1, 1 | 1 | 1, 1, 1, 1 | $(z_k - 0)^2$ |
| 1, 1, 1, 1 | 1 | 1, 1, 1, −1 | $(z_k - 2)^2\alpha$ |
| 1, 1, 1, −1 | 1 | 1, 1, −1, 1 | $(z_k - 4)^2 2\alpha$ |
| 1, 1, 1, −1 | 1 | 1, 1, −1, −1 | $(z_k - 6)^2\alpha$ |
| 1, 1, −1, 1 | 1 | 1, −1, 1, 1 | $(z_k - 0)^2 2\alpha$ |
| 1, 1, −1, 1 | 1 | 1, −1, 1, −1 | $(z_k - 2)^2 3\alpha$ |
| 1, 1, −1, −1 | 1 | 1, −1, −1, 1 | $(z_k - 4)^2 2\alpha$ |
| 1, 1, −1, −1 | 1 | 1, −1, −1, −1 | $(z_k - 6)^2\alpha$ |
| 1, −1, 1, 1 | 1 | −1, 1, 1, 1 | $(z_k - (-4))^2 - 2\alpha$ |
| 1, −1, 1, 1 | 1 | −1, 1, 1, −1 | $(z_k - (-2))^2 3\alpha$ |
| 1, −1, 1, −1 | 1 | −1, 1, −1, 1 | Forbidden Transition |
| 1, −1, 1, −1 | 1 | −1, 1, −1, −1 | $(z_k - 2)^2 3\alpha$ |
| 1, −1, −1, 1 | 1 | −1, −1, 1, 1 | $(z_k - (-4))^2 2\alpha$ |
| 1, −1, −1, 1 | 1 | −1, −1, 1, −1 | $(z_k - (-2))^2 - 3\alpha$ |

TABLE 1-continued

| Next State $a_k, a_{k-1}, a_{k-2}, a_{k-3}$ | Current Symbol $\{a_k\}$ | Current State $a_{k-1}, a_{k-2}, a_{k-3}, a_{k-4}$ | Branch Metric $\lambda_k^{(i)} = (z_k y_k^{(i)})^2 \alpha^{(i)}$ |
|---|---|---|---|
| 1, −1, −1, −1 | 1 | −1, −1, −1, 1 | $(z_k - 0)^2 2\alpha$ |
| 1, −1, −1, −1 | 1 | −1, −1, −1, −1 | $(z_k - 2)^2 \alpha$ |
| −1, 1, 1, 1 | −1 | 1, 1, 1, 1 | $(z_k - (-2))^2 - \alpha$ |
| −1, 1, 1, 1 | −1 | 1, 1, 1, −1 | $(z_k - 0)^2 2\alpha$ |
| −1, 1, 1, −1 | −1 | 1, 1, −1, 1 | $(z_k - 2)^2 3\alpha$ |
| −1, 1, 1, −1 | −1 | 1, 1, −1, −1 | $(z_k - 4)^2 2\alpha$ |
| −1, 1, −1, 1 | −1 | 1, −1, 1, 1 | $(z_k - (-2))^2 3\alpha$ |
| −1, 1, −1, 1 | −1 | 1, −1, 1, −1 | Forbidden Transition |
| −1, 1, −1, −1 | −1 | 1, −1, −1, 1 | $(z_k - 2)^2 3\alpha$ |
| −1, 1, −1, −1 | −1 | 1, −1, −1, −1 | $(z_k - 4)^2 2\alpha$ |
| −1, −1, 1, 1 | −1 | −1, 1, 1, 1 | $(z_k - (-6))^2 \alpha$ |
| −1, 1, 1, 1 | −1 | −1, 1, 1, −1 | $(z_k - (-4))^2 2\alpha$ |
| −1, −1, 1, −1 | −1 | −1, 1, −1, 1 | $(z_k - (-2))^2 3\alpha$ |
| −1, −1, 1, −1 | −1 | −1, 1, −1, −1 | $(z_k - 0)^2 2\alpha$ |
| −1, −1, −1, 1 | −1 | −1, −1, 1, 1 | $(z_k - (-6))^2 \alpha$ |
| −1, −1, −1, 1 | −1 | −1, −1, 1, −1 | $(z_k - (-4))^2 2\alpha$ |
| −1, −1, −1, −1 | −1 | −1, −1, −1, 1 | $(z_k - (-2))^2 \alpha$ |
| −1, −1, −1, −1 | −1 | −1, −1, −1, −1 | $(z_k - 2)^2$ |

Figure 7:
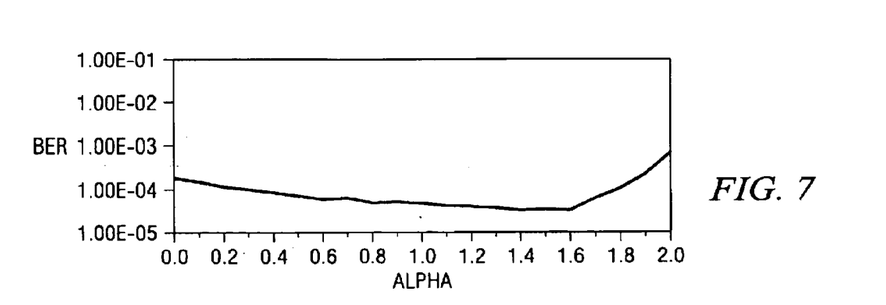
FIG. 7 is a graph of alpha vs. bit error rate (BER) using a modified Viterbi algorithm metric, showing different alpha values at a fixed signal-to-noise ratio (SNR) in an EEPR4 channel with TMTR(8/9) coding, in accordance with a preferred embodiment of the invention.
Figure 8:
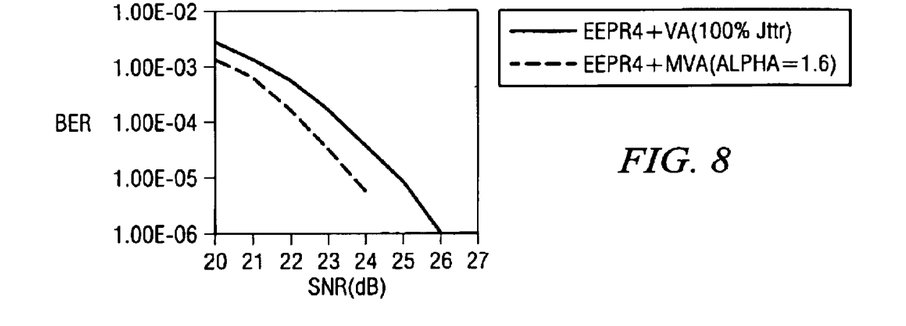
FIG. 8 is a graph of SNR vs. BER for an EEPR4 with a Viterbi algorithm detector, and for an EEPR4 with modified branch metrics, combined with TMTR (8/9) in 100% media noise channel induced by position jitter, with alpha=1.6, in accordance with a preferred embodiment of the invention.

Here it is assumed that Trellis MTR(TMTR) coding is used where maximum of three consecutive transitions are allowed. In FIG. 7, the bit error rate (BER) performances of the EEPR4 with TMTR(8/9) coding using modified branch metric are shown for different values of $\alpha$ at a fixed signal-to-noise ratio (SNR) value. FIG. 8 is a graph of SNR vs. BER for an EEPR4 with a Viterbi algorithm detector, and for an EEPR4 with modified branch metrics, combined with TMTR(8/9) in 100% media noise (position jitter) channel, with $\alpha=1.6$, in accordance with a preferred embodiment of the invention. The BER curves for the conventional VA and modified VA are shown at the $\alpha$ value of 1.6 where it is assumed that the possible ideal samples at the input of the detector are 0, ±2, ±4 or ±6, as shown in Table 1. These curves show about 1.2 dB gain at the BER of $10^{-5}$.

In an EPR4 channel, as shown in equation (2), the noise power due to the position jitter depends on the current transition and the transition which occurs two symbol interval apart. That means the transition one symbol period apart from the current symbol period does not contribute to the noise variance at the current sample. In Table 2, modified branch metrics along with the state transition are listed for an EPR4 channel case where it is assumed that the possible ideal samples at the input of the detector are 0, ±2, and ±4.

TABLE 2

| Next State $a_k, a_{k-1}, a_{k-2}$ | Current Symbol $\{a_k\}$ | Current State $a_{k-1}, a_{k-2}, a_{k-3}$ | Branch Metric $\lambda_k^{(i)} = (z_k y_k^{(i)})^2 \alpha^{(i)}$ |
|---|---|---|---|
| 1, 1, 1 | 1 | 1, 1, 1 | $(z_k - 0)^2$ |
| 1, 1, 1 | 1 | 1, 1, −1 | $(z_k - 2)^2 - \alpha$ |
| 1, 1, −1 | 1 | 1, −1, 1 | $(z_k - 2)^2 - \alpha$ |
| 1, 1, −1 | 1 | 1, −1, −1 | $(z_k - 4)^2$ |
| 1, −1, 1 | 1 | −1, 1, 1 | $(z_k - (-2))^2 - \alpha$ |
| 1, −1, 1 | 1 | −1, 1, −1 | $(z_k - 0)^2 2\alpha$ |
| 1, −1, −1 | 1 | −1, −1, 1 | $(z_k - 0)^2 2\alpha$ |
| 1, −1, −1 | 1 | −1, −1, −1 | $(z_k - 2)^2 - \alpha$ |
| −1, 1, 1 | −1 | 1, 1, 1 | $(z_k - (-2))^2 - \alpha$ |
| −1, 1, 1 | −1 | 1, 1, −1 | $(z_k - 0)^2 2\alpha$ |
| −1, 1, −1 | −1 | 1, −1, 1 | $(z_k - 0)^2 2\alpha$ |
| −1, 1, −1 | −1 | 1, −1, −1 | $(z_k - 2)^2 - \alpha$ |
| −1, −1, 1 | −1 | −1, 1, 1 | $(z_k - (-4))^2$ |
| −1, −1, 1 | −1 | −1, 1, −1 | $(z_k - (-2))^2 - \alpha$ |
| −1, −1, −1 | −1 | −1, −1, 1 | $(z_k - (-2))^2 - \alpha$ |
| −1, −1, −1 | −1 | −1, −1, −1 | $(z_k - 0)^2$ |

A state diagram in NRZ domain showing the additive branch metric adjustments is shown in FIG. 5, described above. A similar state diagram may be easily derived for the EEPR4 embodiment described above from the values in Table 1.

Figure 9:
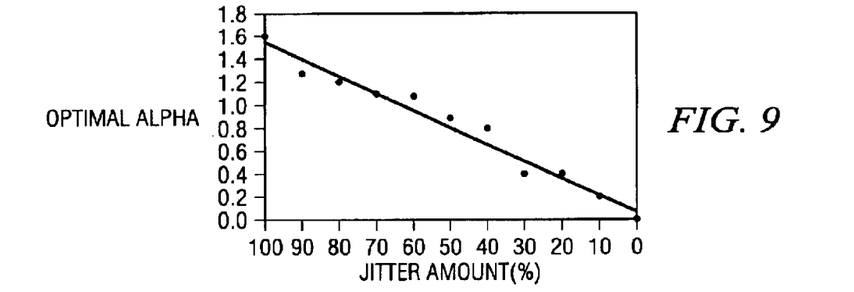
FIG. 9 is a graph of jitter percentage vs. optimal alpha for different amounts of the jitter noise in an EEPR4(8/9TMTR) channel.

FIG. 9 is a graph of jitter percentage vs. optimal alpha for different amounts of position of jitter noise in an EEPR4(8/9TMTR) channel. In FIG. 9, the BER curves for the conventional VA and modified VA with (0, 6/6)(16/17) coding are compared at the $\alpha$ value of 0.45. These curves show about 0.7 dB gain at the BER $10^5$.

Figure 10:
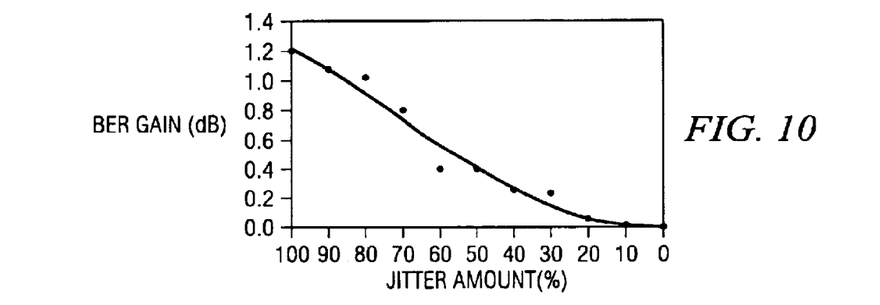
FIG. 10 is a graph of jitter noise percentage vs. BER showing the performance gain of a detector constructed, in accordance with a preferred embodiment of the invention, over the conventional Viterbi algorithm at different amounts of position jitter noise in an EEPR4(8/9TMTR) channel.
Figure 11:
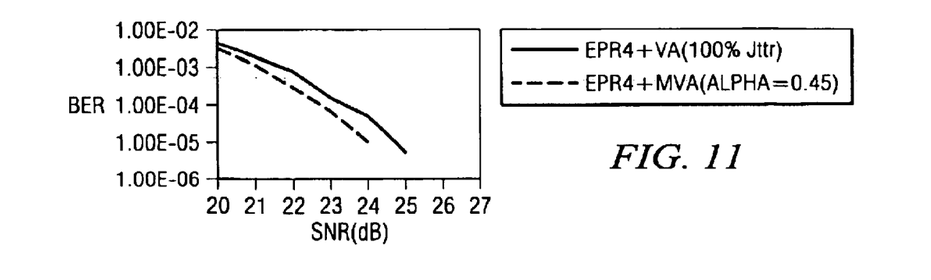
FIG. 11 is a graph of SNR vs. BER for EPR4 with a Viterbi algorithm detector, and for an EPR4 with modified branch metrics, combined with (0, 6/6)(16/17) coding in a channel with 100% media noise induced by the position jitter, in accordance with a preferred embodiment of the invention.

FIG. 10 is a graph of jitter percentage vs. BER showing the performance gain of a detector constructed, in accordance with a preferred embodiment of the invention, over the conventional Viterbi algorithm at different amounts of position jitter noise in an EEPR4(8/9TMTR) channel. FIG. 11 is a graph of SNR vs. BER for EPR4 with a Viterbi algorithm detector, and for an EPR4 with modified branch metrics, combined with (0, 6/6)(16/17) coding in a channel with 100% media noise (position jitter channel, in accordance with a preferred embodiment of the invention.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A method for decoding a received value, comprising:
determining whether said received value is in a space containing first and second possible decode values, said space having a boundary substantially equidistant from said first and second possible decode values and separating said first and second possible decode values, wherein if said received value is within a first portion of said space closest to a point associated with first decode value, said received value is decoded as said first decode value, and if said received value is within a second portion of said space closest to a point associated with second decode value, it is decoded as said second decode value;
producing a value that estimates an amount of jitter noise in a channel through which said received value has passed;
and moving said boundary an additive amount determined by said value that estimates an amount of jitter noise, wherein said boundary is moved to enlarge whichever of said first and second spaces that contains a larger amount of jitter noise.

2. The method of claim 1 wherein said producing a value that estimates an amount of jitter noise contained in the received value represented by a series of bit values is dynamically performed.

3. The method of claim 1 wherein said producing a value that estimates an amount of jitter noise contained in the received value represented by a series of bit values is adaptively performed.

4. The method of claim 1 wherein said producing a value that estimates an amount of jitter noise contained in the received value represented by a series of bit values is statically performed.

5. The method of claim 1 wherein said producing a value that estimates an amount of jitter noise contained in the received value represented by a series of bit values is performed by adding a correction value to a value representing a distance between said decode values.

6. The method of claim 5 wherein said correction value is determined by determining a number of transitions at specific locations in said decode values.

7. The method of claim 1 further comprising multiplying said number of transitions at specific locations by a weighting factor.

8. The method of claim 1 further comprising determining said weighting factor by determining a noise variance value of a channel in which said received values exist.

9. A Viterbi detector, comprising:

circuitry for determining whether a received value represented by a series of bit values is either of first or second decode value, said circuitry having first and second spaces containing a set of possible received values, said first and second spaces respectively surrounding each of said points associated with said first and second decode values, said circuitry having a boundary separating said first and second spaces, wherein if a detected value is within said first space it is decoded as said first decode value, and if said detected value is within said second space, it is decoded as said decode second value;

circuitry for producing a value that estimates an amount of jitter noise contained in the received value;

and circuitry moving said boundary an amount determined by said value that estimates an amount of jitter noise, wherein said boundary is moved to enlarge whichever of said first and second spaces that contains the largest amount of jitter noise.

10. The Viterbi detector of claim 9 wherein said circuitry for producing a value that estimates an amount of jitter noise dynamically produces said value.

11. The Viterbi detector of claim 9 wherein said circuitry for producing a value that estimates an amount of jitter noise adaptively produces said value.

12. The Viterbi detector of claim 9 wherein said circuitry for producing a value that estimates an amount of jitter noise uses statically produced values.

13. The Viterbi detector of claim 9 wherein said circuitry producing a value that estimates an amount of jitter noise adds a correction value to a value representing a distance between said decode values.

14. The Viterbi detector of claim 9 wherein said correction value is determined by determining a number of transitions in said decode values.

15. The Viterbi detector of claim 14 further comprising a circuit for multiplying said number of transitions at specific locations by a weighting factor.

16. The Viterbi detector of claim 15 wherein said weighting factor represents a noise value of a channel in which said received value exist.

17. A Viterbi detector, comprising:
circuitry for receiving an equalized received signal in an EEPR4 channel to decode said signal according to the following table:

| Next State $a_k, a_{k-1}, a_{k-2}, a_{k-3}$ | Current Symbol $\{a_k\}$ | Current State $a_{k-1}, a_{k-2}, a_{k-3}, a_{k-4}$ | Branch Metric $\lambda_k^{(i)} = (z_k y_k^{(i)})^2 \alpha^{(i)}$ |
|---|---|---|---|
| 1, 1, 1, 1 | 1 | 1, 1, 1, 1 | $(z_k - 0)^2$ |
| 1, 1, 1, 1 | 1 | 1, 1, 1, -1 | $(z_k - 2)^2 \alpha$ |
| 1, 1, 1, -1 | 1 | 1, 1, -1, 1 | $(z_k - 4)^2 2\alpha$ |
| 1, 1, 1, -1 | 1 | 1, 1, -1, -1 | $(z_k - 6)^2 \alpha$ |
| 1, 1, -1, 1 | 1 | 1, -1, 1, 1 | $(z_k - 0)^2 2\alpha$ |

-continued

| Next State $a_k, a_{k-1}, a_{k-2}, a_{k-3}$ | Current Symbol $\{a_k\}$ | Current State $a_{k-1}, a_{k-2}, a_{k-3}, a_{k-4}$ | Branch Metric $\lambda_k^{(i)} = (z_k y_k^{(i)})^2 \alpha^{(i)}$ |
|---|---|---|---|
| 1, 1, -1, 1 | 1 | 1, -1, 1, -1 | $(z_k - 2)^2 3\alpha$ |
| 1, 1, -1, -1 | 1 | 1, -1, -1, 1 | $(z_k - 4)^2 2\alpha$ |
| 1, 1, -1, -1 | 1 | 1, -1, -1, -1 | $(z_k - 6)^2 \alpha$ |
| 1, -1, 1, 1 | 1 | -1, 1, 1, 1 | $(z_k - (-4))^2 - 2\alpha$ |
| 1, -1, 1, 1 | 1 | -1, 1, 1, -1 | $(z_k - (-2))^2 3\alpha$ |
| 1, -1, 1, -1 | 1 | -1, 1, -1, 1 | Forbidden Transition |
| 1, -1, 1, -1 | 1 | -1, 1, -1, -1 | $(z_k - 2)^2 3\alpha$ |
| 1, -1, -1, 1 | 1 | -1, -1, 1, 1 | $(z_k - (-4))^2 2\alpha$ |
| 1, -1, -1, 1 | 1 | -1, -1, 1, -1 | $(z_k - (-2))^2 - 3\alpha$ |
| 1, -1, -1, -1 | 1 | -1, -1, -1, 1 | $(z_k - 0)^2 2\alpha$ |
| 1, -1, -1, -1 | 1 | -1, -1, -1, -1 | $(z_k - 2)^2 \alpha$ |
| -1, 1, 1, 1 | -1 | 1, 1, 1, 1 | $(z_k - (-2))^2 - \alpha$ |
| -1, 1, 1, 1 | -1 | 1, 1, 1, -1 | $(z_k - 0)^2 2\alpha$ |
| -1, 1, 1, -1 | -1 | 1, 1, -1, 1 | $(z_k - 2)^2 3\alpha$ |
| -1, 1, 1, -1 | -1 | 1, 1, -1, -1 | $(z_k - 4)^2 2\alpha$ |
| -1, 1, -1, 1 | -1 | 1, -1, 1, 1 | $(z_k - (-2))^2 3\alpha$ |
| -1, 1, -1, 1 | -1 | 1, -1, 1, -1 | Forbidden Transition |
| -1, 1, -1, -1 | -1 | 1, -1, -1, 1 | $(z_k - 2)^2 3\alpha$ |
| -1, 1, -1, -1 | -1 | 1, -1, -1, -1 | $(z_k - 4)^2 2\alpha$ |
| -1, -1, 1, 1 | -1 | -1, 1, 1, 1 | $(z_k - (-6))^2 \alpha$ |
| -1, -1, 1, 1 | -1 | -1, 1, 1, -1 | $(z_k - (-4))^2 2\alpha$ |
| -1, -1, 1, -1 | -1 | -1, 1, -1, 1 | $(z_k - (-2))^2 3\alpha$ |
| -1, -1, 1, -1 | -1 | -1, 1, -1, -1 | $(z_k - 0)^2 2\alpha$ |
| -1, -1, -1, 1 | -1 | -1, -1, 1, 1 | $(z_k - (-6))^2 \alpha$ |
| -1, -1, -1, 1 | -1 | -1, -1, 1, -1 | $(z_k - (-4))^2 2\alpha$ |
| -1, -1, -1, -1 | -1 | -1, -1, -1, 1 | $(z_k - (-2))^2 \alpha$ |
| -1, -1, -1, -1 | -1 | -1, -1, -1, -1 | $(z_k - 2)^2$ | wherein: $\alpha$ is a predetermined metric adjustment value, k is a time period, $z_k$ is a received value at time k, $\lambda_k^{(i)}$ is a metric used to determine a next state of said Viterbi based upon a maximum likelihood evaluation for an $i^{th}$ branch, $a_k, a_{k-1}, a_{k-2}, a_{k-3}$ are received state values in a write current domain at respective time periods k, k-1, k-2, and k-3, respectively, and $y_k$ is an ideal sample associated with an $i^{th}$ branch.

18. A Viterbi detector, comprising:
circuitry for receiving an equalized received signal in an EPR4 channel to decode said signal according to the following table:

| Next State $a_k, a_{k-1}, a_{k-2}$ | Current Symbol $\{a_k\}$ | Current State $a_{k-1}, a_{k-2}, a_{k-3}$ | Branch Metric $\lambda_k^{(i)} = (z_k y_k^{(i)})^2 \alpha^{(i)}$ |
|---|---|---|---|
| 1, 1, 1 | 1 | 1, 1, 1 | $(z_k - 0)^2$ |
| 1, 1, 1 | 1 | 1, 1, -1 | $(z_k - 2)^2 - \alpha$ |
| 1, 1, -1 | 1 | 1, -1, 1 | $(z_k - 2)^2 - \alpha$ |
| 1, 1, -1 | 1 | 1, -1, -1 | $(z_k - 4)^2$ |
| 1, -1, 1 | 1 | -1, 1, 1 | $(z_k - (-2))^2 - \alpha$ |
| 1, -1, 1 | 1 | -1, 1, -1 | $(z_k - 0)^2 2\alpha$ |
| 1, -1, -1 | 1 | -1, -1, 1 | $(z_k - 0)^2 2\alpha$ |
| 1, -1, -1 | 1 | -1, -1, -1 | $(z_k - 2)^2 - \alpha$ |
| -1, 1, 1 | -1 | 1, 1, 1 | $(z_k - (-2))^2 - \alpha$ |
| -1, 1, 1 | -1 | 1, 1, -1 | $(z_k - 0)^2 2\alpha$ |
| -1, 1, -1 | -1 | 1, -1, 1 | $(z_k - 0)^2 2\alpha$ |
| -1, 1, -1 | -1 | 1, -1, -1 | $(z_k - 2)^2 - \alpha$ |
| -1, -1, 1 | -1 | -1, 1, 1 | $(z_k - (-4))^2$ |
| -1, -1, 1 | -1 | -1, 1, -1 | $(z_k - (-2))^2 - \alpha$ |
| -1, -1, -1 | -1 | -1, -1, 1 | $(z_k - (-2))^2 - \alpha$ |
| -1, -1, -1 | -1 | -1, -1, -1 | $(z_k - 0)^2$ | wherein: $\alpha$ is predetermined metric adjustment value, k is a time period, $z_k$ is a received value at time k, $\lambda_k^{(i)}$ is a metric used to determine a next state of said Viterbi based upon a maximum likelihood evaluation for an $i^{th}$ branch, $a_k$, $a_{k-1}$, $a_{k-2}$, $a_{k-3}$ are received state values in a write current domain at respective time periods k, k−1, k−2, and k−3, respectively, and $y_k$ is an ideal sample associated with an $i^{th}$ branch.

19. A Viterbi detector, comprising:
   circuitry for receiving an equalized received signal in an EEPR4 channel to decode said signal according to $\lambda_k^{(i)}=(z_k-y_k^{(i)})^2-\alpha^{(i)}$, wherein:
   $\alpha^{(i)}$ is m α,
   α is a positive constant,
   m is a number of transitions,
   $\lambda_k^{(i)}$ is a branch metric at time k for an $i^{th}$ Viterbi branch,
   k is a time period,
   $z_k$ is a received value at time k,
   $\lambda_k^{(i)}$ is a metric used to determine a next state of said Viterbi based upon a maximum likelihood evaluation for an $i^{th}$ branch,
   $a_k$, $a_{k-1}$, $a_{k-2}$, $a_{k-3}$ are received state values in a write current domain at respective time periods k, k−1, k−2, and k−3, respectively, and
   $y_k$ is an ideal sample associated with an $i^{th}$ branch.

20. A mass data storage device of the type in which a sensor detects magnetic transitions recorded on a magnetic media, comprising:
   a Viterbi detector, including:
      circuitry for determining whether a received value represented by a series of bit values is either of first or second decode value, said circuitry having first and second spaces having points associated with a set of possible received values, said first and second spaces respectively surrounding each point associated with said first and second decode value, said circuitry having a boundary separating said first and second spaces, wherein if a detected value is within said first space it is decoded as said first decode value, and if said detected value is within said second space, it is decoded as said decode second value;
      circuitry for producing a value that estimates an amount of jitter noise contained a series of bit values representing the received value;
      and circuitry moving said boundary an amount determined by said value that estimates an amount of jitter noise, wherein said boundary is moved to enlarge whichever of said first and second spaces that contains the largest amount of jitter noise.

21. The mass data storage device of claim 20 wherein said circuitry for producing a value that estimates an amount of jitter noise dynamically produces said value.

22. The mass data storage device of claim 20 wherein said circuitry for producing a value that estimates an amount of jitter noise adaptively produces said value.

23. The mass data storage device of claim 20 wherein said circuitry for producing a value that estimates an amount of jitter noise uses statically produced values.

24. The mass data storage device of claim 20 wherein said circuitry producing a value that estimates an amount of jitter noise adds a correction value to a value representing a distance between said decode values.

25. The mass data storage device of claim 24 wherein said correction value is determined by determining a number of transitions at specific locations in said decode values.

26. The mass data storage device of claim 25 further comprising a circuit for multiplying said number of transitions at specific locations by a weighting factor.

27. The Viterbi detector of claim 26 wherein said weighting factor represents a noise value of a channel in which said received value exist.

28. A method for compensating for jitter noise in a channel in a mass storage device, comprising:
   determining an additive value related to an amount of jitter noise in the channel in dependence upon data bit values received, wherein a magnitude of said jitter noise is related to a number of bit transitions in a word indicating a value to be determined;
   and moving a detection boundary between possible values an amount indicated by the additive value.

* * * * *